US006825087B1

United States Patent
Sharp et al.

(10) Patent No.: US 6,825,087 B1
(45) Date of Patent: Nov. 30, 2004

(54) HYDROGEN ANNEAL FOR CREATING AN ENHANCED TRENCH FOR TRENCH MOSFETS

(75) Inventors: Joelle Sharp, Herriman, UT (US); Gordon K. Madson, Riverton, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/448,884

(22) Filed: Nov. 24, 1999

(51) Int. Cl.$^7$ .......................................... H01L 21/336
(52) U.S. Cl. ................................. 438/296; 438/424
(58) Field of Search ............................ 438/243–249, 438/270, 296, 386–392, 424, 445, 212–213, 489

(56) References Cited

U.S. PATENT DOCUMENTS

| | | | |
|---|---|---|---|
| 5,795,792 A | | 8/1998 | Nishihara |
| 5,915,180 A | * | 6/1999 | Hara et al. .................... 438/270 |
| 5,943,581 A | * | 8/1999 | Lu et al. ...................... 438/386 |
| 5,945,724 A | * | 8/1999 | Parekh et al. ................ 257/510 |
| 6,001,704 A | | 12/1999 | Cheng et al. |
| 6,008,097 A | | 12/1999 | Yoon et al. |
| 6,037,202 A | * | 3/2000 | Witek ........................... 438/212 |
| 6,037,628 A | * | 3/2000 | Huang .......................... 257/329 |
| 6,087,232 A | | 7/2000 | Kim et al. |
| 6,100,132 A | * | 8/2000 | Sato et al. .................... 438/243 |
| 6,133,587 A | * | 10/2000 | Takeuchi et al. ............... 257/77 |
| 6,156,606 A | * | 12/2000 | Michaelis .................... 438/243 |
| 6,159,823 A | * | 12/2000 | Song et al. ................... 438/437 |
| 6,174,785 B1 | * | 1/2001 | Parekh et al. ................ 438/424 |
| 6,228,727 B1 | * | 5/2001 | Lim et al. ..................... 438/296 |
| 6,271,100 B1 | * | 8/2001 | Ballantine et al. ............ 438/424 |
| 6,271,153 B1 | * | 8/2001 | Moore ......................... 438/787 |
| 6,277,706 B1 | * | 8/2001 | Ishikawa ...................... 438/424 |
| 6,291,298 B1 | | 9/2001 | Williams et al. |
| 6,387,764 B1 | * | 5/2002 | Curtis et al. .................. 438/296 |
| 6,566,224 B1 | | 5/2003 | Chang et al. |

OTHER PUBLICATIONS

Peter Singer, "Empty Spaces in Silicon (SS): An Alternative to SOI," *Semiconductor International*, Dec. 1999, p. 42.
Chang et al., "A Highly Manufacturable Corner Rounding Solution for 0.18 μm Shallow Trench Isolation," IEDM Tech. Digest, pp. 661–664 (1997).
Nouri et al., "An Optimized Shallow Trench Isolation for sub–0.18μm ASIC Technologies," SPIE vol. 3506, pp. 156–166 (Sep. 1998).
Matsuda et al., "Novel Corner Rounding Process for Shallow Trench Isolation utilizing MSTS (Micro–Structure Transformation of Silicon)," IEDM Tech. Digest, pp. 137–140 (Dec. 1998).
Nandakumar et al., "Shallow Trench Isolation for advanced ULSI CMOS Technologies," IEDM Tech. Digest, pp. 133–136 (Dec. 1998).

* cited by examiner

*Primary Examiner*—David Nelms
*Assistant Examiner*—David Vu
(74) *Attorney, Agent, or Firm*—Townsend and Townsend and Crew LLP

(57) ABSTRACT

A method of forming a trench in a substrate or in an epitaxial layer, previously grown over the semiconductor substrate, wherein an anneal step, using hydrogen gas results in rounded corners without the need for a rounding etch or any other processing steps to round the corners.

18 Claims, 4 Drawing Sheets

HYDROGEN ANNEAL FOR CREATING AN ENHANCED TRENCH FOR TRENCH MOSFETS

BACKGROUND OF THE INVENTION

The present invention relates in general to semiconductor technology, and in particular to forming an enhanced trench for applications such as trench MOSFETs (Metal Oxide Semiconductor Field Effect Transistors).

Power field effect transistors, such as MOSFETs are well known in the semiconductor industry. One type of MOSFET is a trench MOSFET. Trench MOSFETs typically include a substrate upon which an epitaxial layer is grown; doped source regions of a first charge type (i.e. p or n); a doped well of an opposite charge type from the source regions; one or more trenches that extend into the body of the well(s); a dielectric layer covering the inner wall(s) of the trench(es); a conductive material (e.g. polysilicon) covering the inner wall(s) of the dielectric layer(s), which embody the gate(s) of the trench MOSFET(s); and one or more optional doped heavy body (bodies) of the same charge type as the well(s).

It is desirable that a trench, formed in the fabrication of a trench MOSFET, extend substantially vertically into the body of the well(s). This allows a higher density of trenches to be formed across the semiconductor substrate. Because an anisotropic etch etches substantially in one direction, it is preferred compared to other isotropic etches.

One undesirable side effect that results from use of an anisotropic etch, however, is the sharp edges that form along the top and bottom corners of the trench. If the trench has sharp edges at its corners, it becomes difficult to grow a gate oxide that is uniform in thickness. A gate oxide that varies in thickness becomes subject to nonuniform electric fields along the trench MOSFET channel region, which degrades the performance of the trench MOSFET. This is exacerbated by the fact that a trench MOSFET is typically made up of a large number of trenches, either in a stripped or cellular pattern. In a trench MOSFET, wherein all trenches are fabricated without rounded corners, the peak electric fields tend to move towards the trench corners. By contrast, a series of trenches having rounded corners causes the peak electric fields to move away from the trench corners and toward central locations between adjacent trenches.

One method of smoothing out the corners of a trench is to administer a rounding etch to the trench followed by a downstream plasma etch. However this method, can cause added damage to the silicon and introduces several additional processing steps in the overall process of manufacturing the rounded trench.

It would be desirable, therefore, if a solution were available that could round the trench corners without having to add additional processing steps in the overall process of forming the enhanced trench.

Another critical step in the manufacture of a trench MOSFET is the forming of an oxide layer for the gate electrode, which is as defect-free as possible. This requires that the underlying silicon, upon which the oxide layer is to be grown, itself be as crystalline and as defect-free as possible, so that traps or other defects do not readily form at the silicon/dielectric interface and/or propagate into the dielectric material as it is grown. Such defects can increase the charge density in the oxide layer, thereby lowering the gate oxide breakdown voltage (often characterized by charge breakdown, QBD). A low QBD signifies a trench MOSFET with degraded performance capabilities.

To achieve a high-quality gate oxide with a high QBD, the native oxide that forms on the walls of the silicon trench is typically removed, after which a high-quality gate oxide is grown using thermal oxidation. (A "native oxide" is an oxide that naturally grows on a bare silicon surface when it is exposed to air. ) While a native oxide is for the most part crystalline, it is also prone to defect capture and retention.

One method of removing the native oxide is to perform a wet etch using hydrofluoric (HF) acid. However, use of HF is undesirable in that it not only leaves behind impurity byproducts associated with fluorine, it also calls for additional processing steps (e.g. cleaning steps including washing and drying).

Another prior art method of preparing the trench for gate oxidation is to grow a sacrificial oxide, whereby an oxide is grown and then stripped to remove defects. Unfortunately, just as with the HF etch, such a method requires additional processing steps.

It would be desirable, therefore, if a solution were available that could both prepare the walls of the silicon trench for growing a high-quality gate oxide and, at the same time, round the corners of the trench without having to add additional processing steps in the overall process of manufacturing the trench.

The present invention addresses these problems, by rendering unnecessary the previously required prior art rounding and plasma etch steps (used to round the trench corners) and HF or sacrificial oxide and strip steps (to effect defect reduction prior to growing the gate oxide).

SUMMARY OF THE INVENTION

The present invention provides a method of forming a trench in an epitaxial layer grown on a semiconductor substrate, the trench having rounded corners at the top and bottom ends of the trench. The rounded corners are formed, following formation of the trench by an anneal process, which is preferably performed at a combined high temperature and low pressure so as to prevent the epitaxial layer from melting but is sufficient enough to cause the atoms of the epitaxial layer to migrate and form low stress relief points at the trench corners. The strains at the corners of the trench corners are believed to be stress relief points, which cause the trench corners to conform to an elliptical (or "round") shape.

In a first aspect of the invention, a trench is initially formed that extends a predetermined distance into a semiconductor substrate. Preferably, this trench formation step is performed using an anisotropic etch. Following the trench formation step, the trench is annealed, preferably with hydrogen gas. The anneal step has the benefit of not only reducing the defect density on the walls of the trench but also providing the desirable effect of rounding the top and bottom corners of the trench.

In a second aspect of the invention the rounded trench is formed into an epitaxial layer, previously grown on a semiconductor substrate. The process of annealing the trench is substantially similar to the annealing step described in the first aspect of the invention.

In a third aspect of the invention a method of forming a trench with rounded corners is disclosed, which includes the steps of: (a) providing a semiconductor substrate; (b) forming a masking layer on the major surface of the substrate; (c) selectively etching, through the masking layer to the major surface of the substrate, to define a trench opening access; (d) anisotropically etching, from the trench opening access and into the body of the substrate to form a trench; (e)

removing the selectively etched masking layer; and (f) annealing the trench so that corners at the open and closed ends of the trench become rounded.

In a fourth aspect of the invention, a method of forming a trench MOSFET having trench(es) with rounded corners is disclosed, the rounded corners formed using the anneal step in accordance with the present invention.

In a fifth aspect of the invention, a trench MOSFET is disclosed, the trench(es) of the trench MOSFET having rounded corners formed using the anneal step in accordance with the present invention.

Other features and advantages of the invention will be apparent from the following detailed description and the drawings.

DESCRIPTION OF THE SPECIFIC EMBODIMENTS

Figure 1:
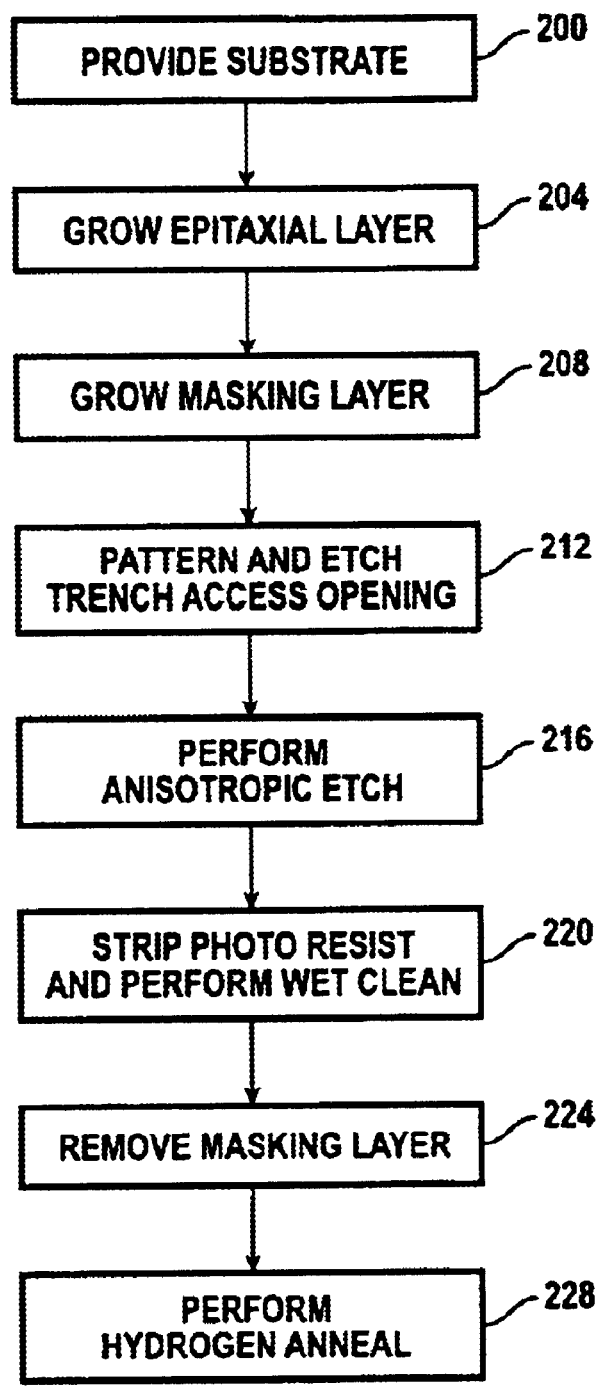
FIG. 1 is a flow diagram illustrating an exemplary process flow for manufacturing a trench with rounded corners in accordance with the present invention.

Referring to FIG. 1, there is shown a flow diagram illustrating an exemplary process flow for manufacturing a trench with rounded corners according to the present invention. The following description of the steps in the process flow is only exemplary and it should be understood that the scope of the invention is not limited to this particular example. In particular, processing conditions such as temperature, pressure, layer thicknesses, etc. could be possibly varied, without departing from the spirit of the invention.

Additionally, the process flow of FIG. 1 is described in terms of forming a single trench. However, it should be recognized that in the case of a trench MOSFET (or other trench applications), one of skill in the art would understand that a series of trenches could be all formed simultaneously. The process flow according to the present invention will be described herein in connection with FIGS. 2A through 2H.

The first step 200 in the process flow (See FIG. 1) is to provide a semiconductor substrate 10. (See FIG. 2A.) In this description, the substrate 10 is taken to be, for the sake of example, n-type and having a standard thickness of, for example, 500 $\mu$m.

Figure 2A:
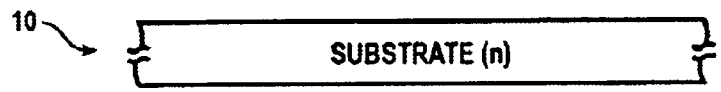
FIG. 2A is a cross-sectional view of a semiconductor substrate.
Figure 2B:
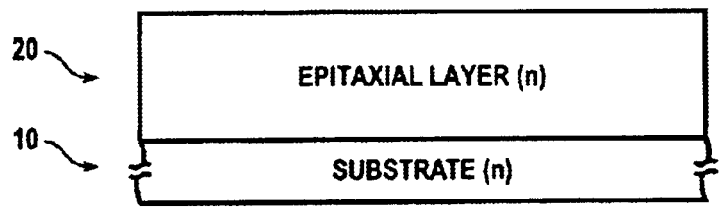
FIG. 2B is a cross-sectional view of the result of growing an epitaxial layer on the substrate of FIG. 2A.

Next, in step 204, an epitaxial layer 20 is grown onto the substrate 10, preferably to a thickness of from about 4 to 10 $\mu$m, as is shown in FIG. 2B. The resistivity of the epitaxial layer 20 is typically from about 0.1 $\Omega$-cm to 3.0 $\Omega$-cm.

Figure 2C:
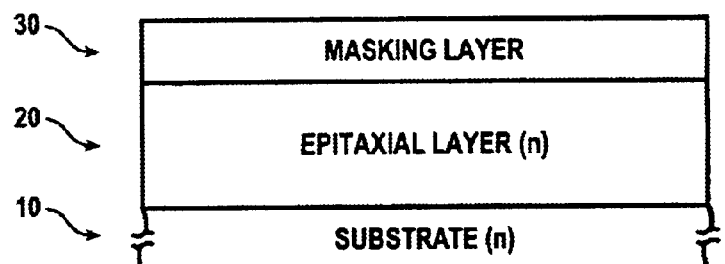
FIG. 2C is a cross-sectional view of the results of growing a masking layer on the epitaxial layer of FIG. 2B.
Figure 2D:
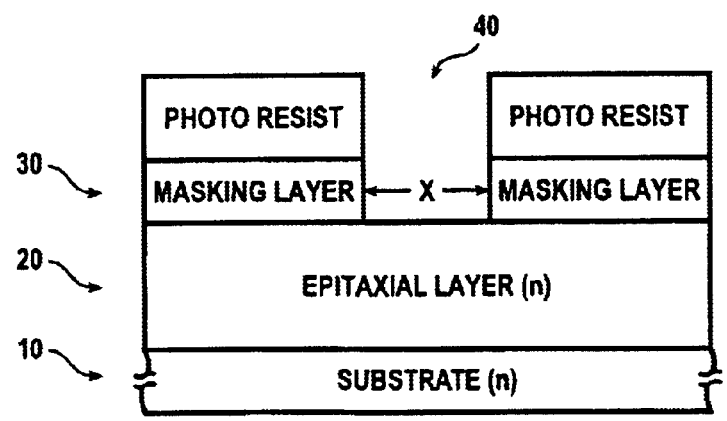
FIG. 2D is a cross-sectional view of the result of patterning and etching through the photo resist and masking layers of FIG. 2C to define a trench opening access.
Figure 2E:
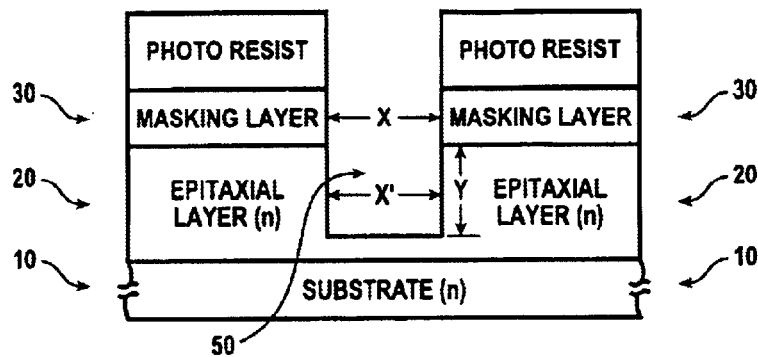
FIG. 2E is a cross-sectional view of the result of performing an anisotropic etch into the trench opening access and through the epitaxial layer to define a trench.

In step 208, a masking layer 30 is formed over the epitaxial layer 20 as shown in FIG. 2C. Preferably, the masking layer 30 is a material made of silicon dioxide ($SiO_2$) and is grown to a thickness of around 1000 Å.

In step 212, the masking layer 30 is patterned using standard photolithography and then selectively etched using, for example, a buffered oxide etch (hydroflouric acid (HF) buffered with ammonium fluoride ($NH_4F$)). A trench opening access 40 into the masking layer 30 is thus formed to a depth that just reaches the surface of the epitaxial layer 20. The trench opening access width, x, (refer to FIG. 2D) is determined by the limitations on the photolithography capabilities employed. Using standard ultraviolet lithography, an exemplary width of the trench opening access is x~0.45 $\mu$m.

In step 216, an anisotropic etch is performed. An anisotropic etch, as it is meant here, is a dry etch that etches substantially in one direction, as compared to an isotropic etch, which etches in more than one direction. Hence, in accordance with the present invention, the anisotropic etch step 216 is used to etch a substantially vertical trench 50 into the epitaxial layer. Typically, the dry etch is in the form of a plasma, which is an almost neutral mixture of energetic molecules, ions and electrons that have been excited in a radio-frequency electric field. Different gases are used depending on the material to be etched. The principal consideration is that the reaction products must be volatile. For etching silicon the preferred reactants are Cl, HBr, $HeO_2$, the preferred pressure is 150 mTorr and the duration of the etch is approximately 235 seconds.

In this exemplary embodiment, the depth, y, of the trench 50 (refer to FIG. 2E) is preferably about 1.5 $\mu$m and the width, x', of the trench 50, is approximately 0.42 $\mu$m at approximately 0.25 $\mu$m deep into the trench.

Figure 2F:
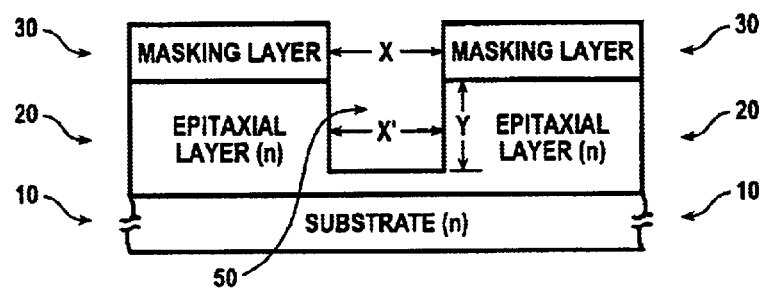
FIG. 2F is a cross-sectional view of the result of stripping the photo resist layer of FIG. 2E.

In step 220, the patterned photo resist is stripped and the trench is wet-cleaned to remove debris left over from the previous steps. The end result is shown in FIG. 2F.

Figure 2G:
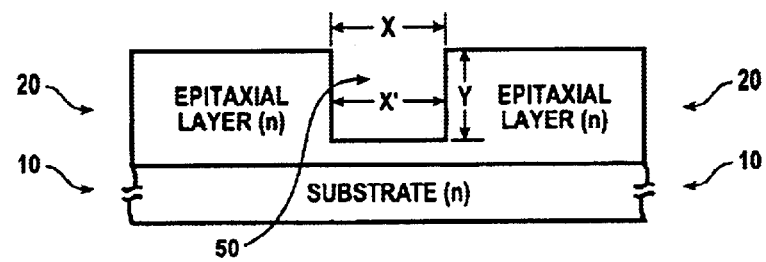
FIG. 2G is a cross-sectional view of the result of removing the masking layer of FIG. 2F.
Figure 2H:
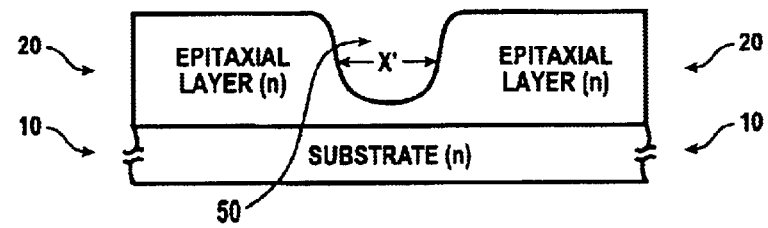
FIG. 2H is a cross-sectional view of the result of performing an anneal in accordance with the present invention.

In step 224, the masking layer 30 is removed using, for example, a wet etch process that is known in the art. The end result of this step is shown in FIG. 2G.

Finally, in step 228, an anneal is performed. Preferably, the anneal is performed using hydrogen gas at a temperature of approximately 1100° C. and a pressure of approximately 100 Torr (or~$1.3\times10^4$ Pa). Use of hydrogen gas reduces the oxygen of the native oxide layer formed on the walls of the trench. The oxygen reduction process has the effect of tying up dangling bonds on the silicon surface defining the walls of the trench such that the dangling bonds become hydrogen terminated. This condition is desirable, since it allows a higher quality gate oxide to be grown later than what would be grown over the native oxide. Indeed, use of the hydrogen anneal step in the manufacture of a trench MOSFET according to the present invention can improve QBD by approximately three orders of magnitude.

The anneal step has the effect of not only reducing the oxygen of the native oxide layer, it also causes the upper and lower corners of the trench 50 to become rounded.

Other temperatures and pressures can be used in the anneal step 228. For example, the process can also cause the altering of the shape of the corners of the trench 50 at temperatures within the range of 960 to 1160° C. and pressures within the range of 40 to 240 Torr (or~$5.3\times10^3$ to $3.2\times10^4$ Pa).

The benefits gained from the hydrogen anneal step 228 of the present invention are three-fold. First, the anneal step 228 restores the epitaxial layer surface in the trench to a surface that is substantially defect-free and ready for gate oxide growth via thermal oxidation. Second, the annealing step 228 has the effect of rounding the corners of the trench (See FIG. 2H). Finally, since the rounding etch and HF etch or sacrificial oxide steps used in conventional trench formation processes are not needed, the entire enhanced trench manufacturing process can be performed with less processing steps.

It is believed that the silicon rounding phenomenon, which takes place during the hydrogen anneal step 228, is caused by the excitation of silicon atoms near the top and bottom corners of the trench. At elevated temperatures, within the range of, for example, 960 to 1160° C. and pressures in the range of, for example, 40 to 240 Torr (~5.3 ×10$^3$ to 3.2×10$^4$ Pa), not only is kinetic energy conveyed to individual atoms but high stress points are believed to form at the corners of the trench, which intensify the strain imparted to the silicon bonds as they seek out stress relief positions. These stress relief positions are substantially elliptical (or "round") in shape.

The processing of a trench using the hydrogen anneal process according to the present invention, can be viewed as an independent process module, which can be performed at different points within the process flow of a variety of different trench MOSFET processes. For example, this trench anneal module can be used in the manufacture of a trench MOSFET, as described in the next paragraph, by employing the module prior to formation of the well (body) and source regions of the trench MOSFET. Alternatively, because of its modularity, the trench formation process can also be performed in a different trench MOSFET embodiment, e.g. after formation of the last dopant junction (i.e. after formation of the well, source and heavy body regions).

Figure 3:
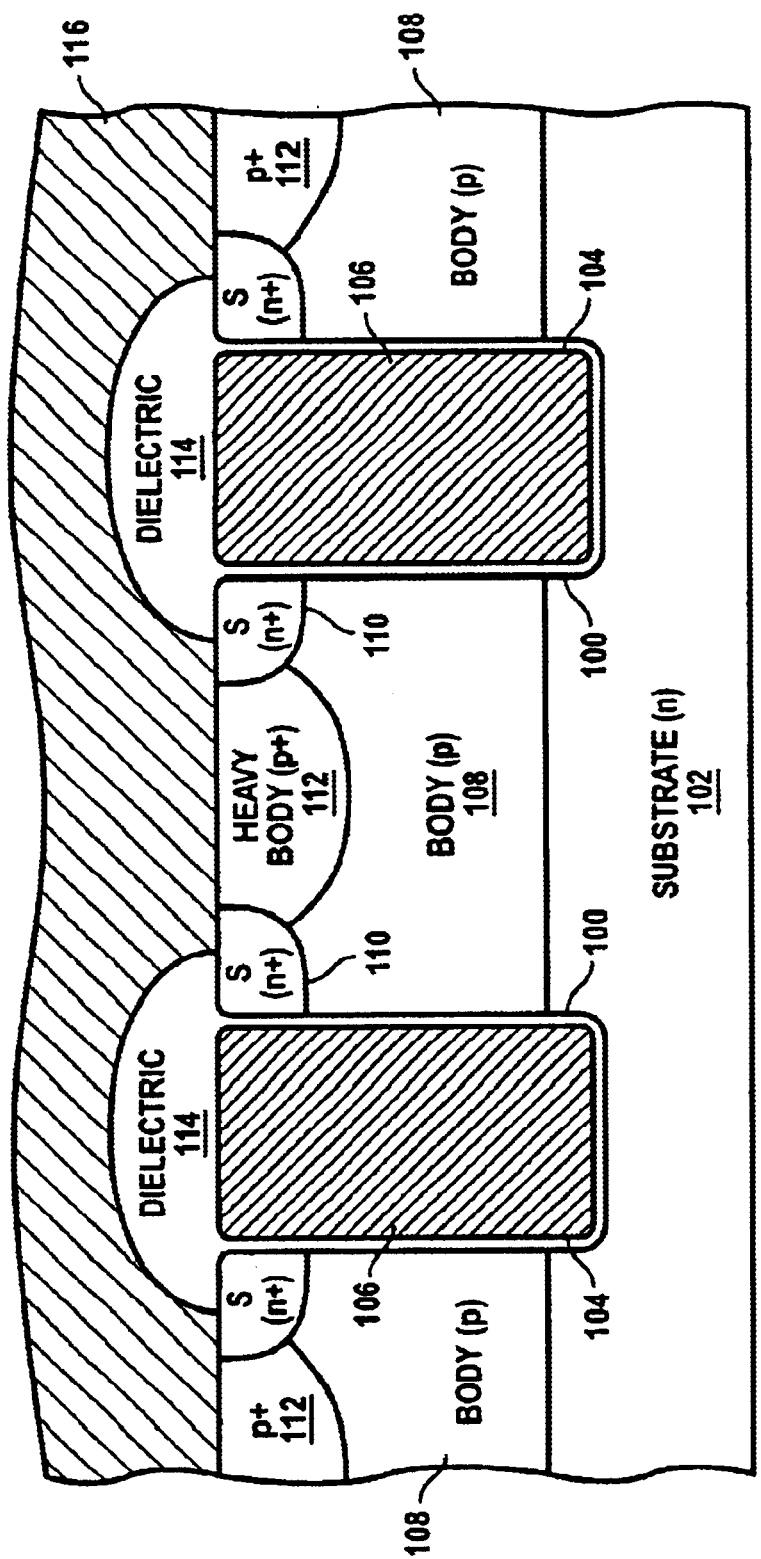
FIG. 3 is a cross-sectional view of a portion of a trench MOSFET.

FIG. 3 shows a simplified cross-section of a portion of an exemplary trench MOSFET. Referring to FIG. 3, trenches 100 extend into a substrate 102, which typically includes an epitaxial layer (not shown). The susbstrate 102 acts as the drain of the trench MOSFET. Each trench 100 is lined with an electrically insulating or dielectric material 104, such as silicon dioxide (SiO$_2$), which acts as the gate oxide. The trench 100 is then filled with a conductive material 106, such as polysilicon, which provides the electrode for the gate of the trench MOSFET. A well or body region 108 is formed on top of substrate 102, and source regions 110 are formed on both sides of each trench 100 as shown. A region referred to as heavy body 112 extends between source regions 110 between adjacent trenches 100. Dielectric material 114 covers trench openings and its adjacent source regions. A layer of metal 116 blankets the top surface of the silicon. For an n-channel MOSFET, the doping polarities for the various regions would be as follows: n-type substrate 102 (providing the drain terminal of the transistor), p-type body 108, p+ heavy body 112, and n+ source 110. The active region of the field effect transistor is thus formed between source 110 and substrate (or drain) 102 along the sides of each trench (or gate) 100.

An example of a trench MOSFET process describing in greater detail the various steps before and after the trench formation process module can be found in commonly-assigned U.S. patent application Ser. No. 08/970,221, entitled "Field Effect Transistor and Method of Its Manufacture," which is hereby incorporated by reference.

Incorporation of the trench process module of the present invention, into the manufacturing process of a trench MOSFET, can, therefore, produce a higher performance trench MOSFET, which displays a more uniform electric field distribution around the gate area and reduced gate leakage currents.

Although the invention has been described in terms of a preferred process and structure, it will be obvious to those skilled in the art that many modifications and alterations may be made to the disclosed embodiment without departing from the invention. For example, one of skill in the art would understand that a p-type substrate and/or p-type epitaxial layer could modify the disclosed process. Also, although the process of the present invention has been described as having a step of growing an epitaxial layer 20 on the starting substrate 10, it need not necessarily be performed. Hence, these modifications and alterations are intended to be considered as within the spirit and scope of the invention as defined by the appended claims.

What is claimed is:

1. A method of forming a trench in a semiconductor substrate, the trench defined by an open end at a major surface of the substrate and a closed end within the body of the substrate, the method comprising the steps of:
    (a) forming a trench that extends a predetermined distance into the substrate; and
    (b) annealing the trench using hydrogen gas in the absence of oxygen gas to:
        (1) round corners at the open and closed ends of the trench, and
        (2) reduce oxygen of a native oxide layer on walls of the trench.

2. The method of claim 1 further comprising growing a dielectric layer on the walls of the trench.

3. The method of claim 2 further comprising forming a conductor over the dielectric layer.

4. The method of claim 1, wherein the step of annealing is performed within a temperature range of about 960 to 1160° C. and within a pressure range of about 40 to 240 Torr.

5. The method of claim 1, wherein the step of forming the trench, is performed using an anisotropic etch.

6. The method of claim 5, wherein following the annealing step, the width of the trench away from the rounded ends, remains substantially the same as the width prior to the annealing step.

7. A method of forming a trench in a semiconductor substrate, the trench defined by an open end at a major surface of the substrate and by a closed end within the body of the substrate, the method comprising the steps of:
    (a) providing a substrate;
    (b) growing a masking layer on the major surface of the substrate;
    (c) selectively etching, through the masking layer to the major surface of the substrate, to define a trench opening access;
    (d) anisotropically etching, from the trench opening access and into the body of the substrate to form a trench;
    (e) removing the selectively etched masking layer; and
    (f) annealing the trench using hydrogen gas in the absence of oxygen gas so that corners at the open and closed ends of the trench become rounded and to reduce oxygen of a native oxide layer on walls of the trench.

8. The method of claim 7, wherein the step of annealing is performed within a temperature range of about 960 to 1160° C. and within a pressure range of about 40 to 240 Torr.

9. A method of forming a trench in an epitaxial layer of a semiconductor substrate, the trench defined by a closed end at a major surface of the epitaxial layer and a closed end within the body of the epitaxial layer, the method comprising the steps of:

(a) forming a trench that extends a predetermined distance into the epitaxial layer; and (b) annealing the trench using hydrogen gas in the absence of oxygen gas so that corners at the open and closed ends of the trench become rounded.

10. The method of claim 9, wherein the step of annealing is performed within a temperature range of about 960 to 1160° C. and within a pressure range of about 40 to 240 Torr.

11. The method of claim 9, wherein the step of annealing also functions to reduce the number of material defects in and/or on the walls of the trench.

12. The method of claim 9, wherein the step of forming the trench is performed using an anisotropic etch.

13. The method of claim 12, wherein, following the annealing step, the width of the trench, away from the rounded ends, remains substantially the same as the width prior to the annealing step.

14. A method of making a trench field effect transistor, comprising:

(a) providing a semiconductor substrate of a first dopant charge type, the substrate embodying the drain of the trench field effect transistor;

(b) growing an epitaxial layer of the same first dopant charge type on the substrate, the epitaxial layer having a different resistivity than the resistivity of the substrate;

(c) forming at least one trench into the epitaxial layer, each trench defined by a first end in a plane defined by a major surface of the substrate and by walls that extend to a second end at a predetermined depth into the epitaxial layer;

(d) annealing the at least one trench using hydrogen gas in the absence of oxygen gas to:

(1) round corners at the first and second ends of the at least one trench, and (2) reduce oxygen of a native oxide layer on the walls of the at least one trench;

(e) growing a dielectric layer on the walls of the at least one trench;

(f) forming a conductor over the dielectric layer, the conductor embodying the gate of the trench field effect transistor;

(g) patterning the epitaxial layer and implanting a dopant of a second charge type to form wells interposed between adjacent trenches; and (h) patterning the epitaxial layer and implanting a dopant of the first charge type to form regions that embody the source regions of the field effect transistor.

15. The method of claim 14, further including the step of forming one or more heavy bodies of the second charge type positioned above the wells and between the source regions, each heavy body forming an abrupt junction with its corresponding well.

16. The method of claim 14, wherein the step of annealing is performed within a temperature range of about 960 to 1160° C. and within a pressure range of about 40 to 240 Torr.

17. The method of claim 14, wherein the step of forming the at least one trench is performed using an anisotropic etch.

18. A method of forming a trench in a semiconductor substrate, the trench defined by an open end at a major surface of the substrate and a closed end within the body of the substrate, the method comprising the steps of:

(a) forming a trench that extends a predetermined distance into the substrate; and (b) annealing the trench to:

(1) reduce the number of defects in the trench created during the step of forming, and (2) round corners at the open and closed ends of the trench, wherein the step of annealing is performed using hydrogen gas within a temperature range of about 960 to 1160° C. and within a pressure range of about 40 to 240 Torr.

* * * * *